(12) United States Patent
Zollars et al.

(10) Patent No.: US 8,878,114 B2
(45) Date of Patent: Nov. 4, 2014

(54) APPARATUS AND METHODS FOR LOCATING SOURCE OF AND ANALYZING ELECTROMAGNETIC RADIATION

(75) Inventors: Bryon G. Zollars, Georgetown, TX (US); Steve M. Savoy, Austin, TX (US); Michael W. Mayo, Austin, TX (US); Daniel R. Mitchell, Austin, TX (US)

(73) Assignee: Nanohmics, Inc., Austin, TX (US)

( * ) Notice: Subject to any disclaimer, the term of this patent is extended or adjusted under 35 U.S.C. 154(b) by 265 days.

(21) Appl. No.: 13/587,017

(22) Filed: Aug. 16, 2012

(65) Prior Publication Data

US 2014/0049772 A1    Feb. 20, 2014

(51) Int. Cl.
*G01B 11/26*    (2006.01)

(52) U.S. Cl.
USPC ................................... 250/206.1; 250/201.1

(58) Field of Classification Search
USPC ............... 356/139.03, 139.04; 250/206.1, 250/201.1–201.3, 216; 136/246
See application file for complete search history.

(56) References Cited

U.S. PATENT DOCUMENTS

| | | | |
|---|---|---|---|
| 3,381,569 A * | 5/1968 | Hatcher | 356/4.03 |
| 3,764,198 A | 10/1973 | Hunzinger | |
| 3,946,233 A | 3/1976 | Erben et al. | |
| 4,092,072 A | 5/1978 | Ellis | |
| 4,136,568 A | 1/1979 | Seymour | |
| 4,193,689 A | 3/1980 | Reymond et al. | |
| 4,315,690 A | 2/1982 | Trocellier et al. | |
| 4,325,633 A | 4/1982 | Gardner | |
| 4,403,247 A | 9/1983 | Sone et al. | |
| 4,467,194 A | 8/1984 | Foreman | |
| 4,477,832 A | 10/1984 | Takemura | |
| 4,554,447 A | 11/1985 | Howard et al. | |
| 4,644,267 A | 2/1987 | Tsui et al. | |
| 4,670,777 A | 6/1987 | Ishikawa et al. | |
| 4,674,874 A | 6/1987 | Halldorsson et al. | |
| 4,709,580 A * | 12/1987 | Butts et al. | 73/178 R |
| 4,769,546 A | 9/1988 | Kniffler et al. | |
| 4,806,747 A | 2/1989 | Dunavan et al. | |
| 4,808,501 A | 2/1989 | Chiulli | |
| 4,855,588 A | 8/1989 | Holmes | |
| 4,857,721 A | 8/1989 | Dunavan et al. | |
| 4,868,378 A | 9/1989 | Biverot | |
| 4,944,588 A | 7/1990 | Kohler | |
| 4,946,277 A | 8/1990 | Marquet et al. | |
| 4,962,311 A | 10/1990 | Poisel et al. | |
| 5,103,088 A | 4/1992 | Halldorsson et al. | |
| 5,140,396 A | 8/1992 | Needham et al. | |

(Continued)

FOREIGN PATENT DOCUMENTS

EP    0293049    11/1988

OTHER PUBLICATIONS

Miller, Jr., et al; United States Statutory Invention Registration "Coordinate Position Detector" published Jan. 5, 1988.

*Primary Examiner* — Tony Ko
(74) *Attorney, Agent, or Firm* — Claude Cooke, Jr.; Cooke Law Firm

(57) ABSTRACT

Detectors and methods for gathering, detecting and analyzing electromagnetic radiation are disclosed. A radiation detector includes one or more positive lenses to direct radiation to mirrors or to a photodetector. Coordinates of directed radiation are measured and interpreted to determine the angle of arrival. A color filter mosaic may be present to determine wavelengths of detected radiation. Temporal characteristics of the radiation may be measured.

24 Claims, 12 Drawing Sheets

(56) References Cited

U.S. PATENT DOCUMENTS

| | | |
|---|---|---|
| 5,227,859 A | 7/1993 | Leib et al. |
| 5,258,609 A | 11/1993 | Holmes |
| 5,280,167 A | 1/1994 | Dubois |
| 5,428,215 A | 6/1995 | Dubois et al. |
| 5,440,116 A | 8/1995 | Bolander et al. |
| 5,600,434 A | 2/1997 | Warm et al. |
| 5,604,695 A | 2/1997 | Cantin et al. |
| 6,137,100 A | 10/2000 | Fossum et al. |
| 6,292,212 B1 | 9/2001 | Zigadlo et al. |
| 6,362,513 B2 | 3/2002 | Wester |
| 6,590,222 B1 | 7/2003 | Bisset et al. |
| 6,783,900 B2 | 8/2004 | Venkatakaman |
| 6,864,969 B1 * | 3/2005 | Borner .................. 356/139.03 |
| 6,882,409 B1 | 4/2005 | Evans et al. |
| 7,196,301 B2 | 3/2007 | Thomas et al. |
| 7,397,019 B1 | 7/2008 | Byars et al. |
| 2004/0104334 A1 | 6/2004 | Gal et al. |
| 2004/0174290 A1 | 9/2004 | Longbottom |
| 2005/0167569 A1 | 8/2005 | Akano |
| 2006/0108499 A1 | 5/2006 | Fortin et al. |
| 2008/0002192 A1 | 1/2008 | David |

\* cited by examiner

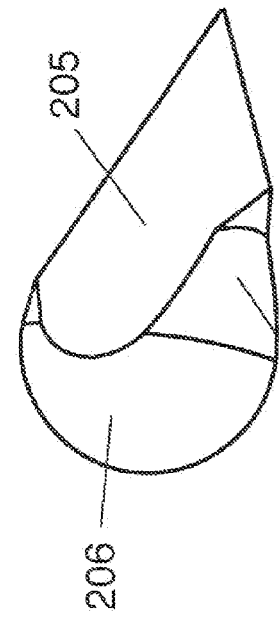
FIG. 2B
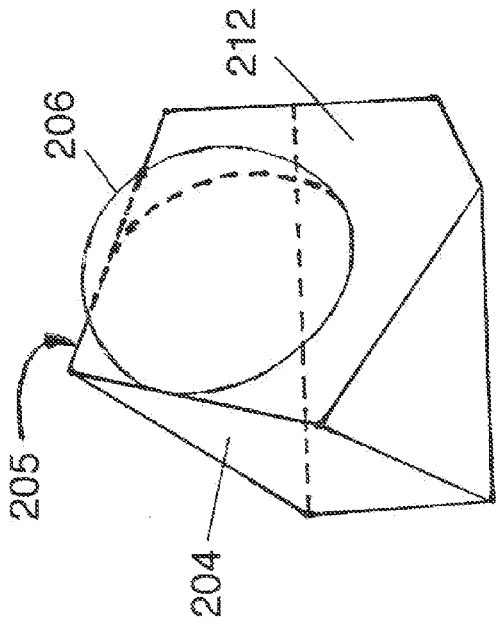
FIG. 2C
FIG. 2E
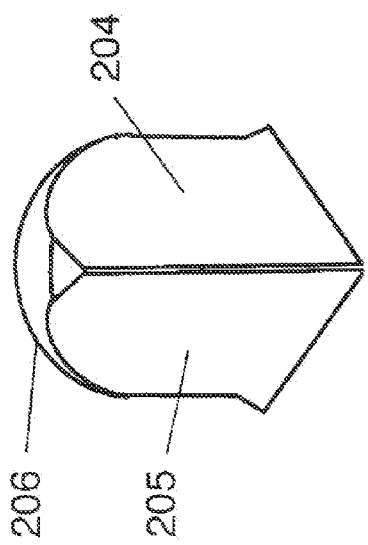
FIG. 2D

APPARATUS AND METHODS FOR LOCATING SOURCE OF AND ANALYZING ELECTROMAGNETIC RADIATION

STATEMENT REGARDING FEDERALLY SPONSORED RESEARCH

The invention was made with Government support under Contract Number FA8650-06-C-1016 and Contract Number FA9453-11-M-0090 awarded by the United States Air Force. The Government has certain rights in the invention.

BACKGROUND OF THE INVENTION

1. Field of the Invention

This invention relates to apparatus and methods for gathering electromagnetic radiation, measuring the direction to the source of the radiation, and analyzing the radiation. In some embodiments, optical components of the apparatus may be employed in solar power applications.

2. Description of Related Art

In recent years numerous instances of commercial aircraft being irradiated with laser beams have been reported. These often turn out to be the actions of pranksters, but the result may be distractions to the flight crew and, with sufficient power in the laser, eye damage to the flight crew. Incidents of laser distraction of pilots usually occur when the aircraft is upon approach to land, which is the most dangerous part of flight. Pilots may wish to take countermeasures to protect themselves from the effects of the laser beam. For military operations, offensive laser systems designed specifically to destroy pilot eyesight have been developed.

Many tactical weapon targeting systems, such as anti-aircraft, anti-tank, and anti-satellite systems use lasers to designate targets and/or determine range to a target. Lasers may be used to designate any type of target, including buildings, vehicles, military and civilian aircraft, spacecraft, and individual people. In some cases, laser irradiation may prevent imaging devices, like those for reconnaissance or security, from viewing a desired scene without being overloaded by the high-brightness laser source. In other cases, laser irradiation may be used to interfere with an optical communication system by either overloading optical detectors or by overpowering a legitimate signal with one containing interfering information. Furthermore, laser irradiation is often not apparent, as many lasers do not radiate in the visible portion of the light spectrum.

Targets of laser irradiation could benefit from the ability to detect and overcome such interferences when they are irradiated. A laser detection system can enable a potential target to take evasive action, deploy countermeasures, or employ protective measures. Current laser detectors are inefficient and inaccurate at detecting the location of interfering radiation source, necessitating a need for the use of multiple, expensive detectors. Furthermore, existing laser detection systems do not have the ability to determine whether a laser irradiating a craft is a danger requiring protective action or merely a nuisance to be ignored. A need exists for more accurate, efficient, and effective laser detector systems.

Dubois et al. (U.S. Pat. No. 5,428,215) and Cantin et al. (U.S. Pat. No. 5,604,695) disclose High Angular Resolution Laser Irradiation Detectors (HARLID) with a linear array of radiation detectors below shadow masks with a series of slots (Dubois) or transparent apertures (Cantin). The pattern of detectors that are or are not irradiated is used to determine the angle of radiation arrival. However, the resolution of these systems is low and dependent on using multiple detectors, such that obtaining even a rough position estimate of the radiation source is difficult. In addition, these devices are incapable of detecting laser irradiation arriving from across an entire hemisphere. Rather, they more easily detect radiation that arrives near to perpendicular to the detector surface and often fail to detect radiation that arrives at an angle closer to horizontal to the detector surface. Furthermore, these detectors are incapable of determining the wavelength of incoming radiation.

Thomas et al. (U.S. Pat. No. 7,196,301) disclose a laser detector that includes an array of lenses and an array of optic devices (including light sources and light detectors). To estimate the angle of radiation arrival, the lens is adjusted to determine the position at which energy from the incoming laser is maximized. Like the Dubois and Cantin devices, this detector is incapable of detecting laser irradiation arriving from across an entire hemisphere. The device has moving parts and a limited angular range, and is incapable of detecting the wavelength of incoming radiation, and lacks the capability to detect information placed on a laser beam via modulation.

A need remains for a laser detection system that can identify at least the wavelength and angle of arrival of laser radiation, that has the ability to decode modulated or pulsed light, and that is capable of functioning in any ambient light conditions (i.e., day or night). A radiation detector and analysis system with these capabilities could significantly enhance laser detection and eliminate the current necessity for multiple detectors under a variety of conditions.

BRIEF SUMMARY OF THE INVENTION

In embodiments of the invention, radiation is directed to a photodetector by positive lenses and flat mirrors. More particularly, positive lenses gather radiation, which may be from a laser or other source of radiation, and direct the radiation to a photodetector or to a mirror, from which it is reflected to a photodetector. The apparatus optionally includes means for wavelength, radiation intensity or "irradiance", and temporal analysis. In optional embodiments, gathered radiation may be directed onto a color filter mosaic, comprising an optical filter or an array of optical filters, and thence onto a photodetector or photodetector array. The direction from which the radiation originates is determined from the size and location of the position or positions on the photodetector or photodetector array where the radiation is detected. The wavelength or wavelengths of the radiation are determined by identifying the amount of light passing through a specific filter or filters in a color filter mosaic. In other optional embodiments, average irradiance and modulation of the radiation over a period of time may be determined by measuring the average and temporal characteristics of the photodetector signal. Processing electronics are provided that analyze the photodetector signal and provide the angle of arrival, wavelength, irradiance, and modulation of incoming radiation. The processing electronics may provide an indication of a threat potential to a user via an electronic signal. Embodiments may be designed for day and/or night operation. In specific embodiments the apparatus is configured to gather, detect, and analyze radiation arriving from across an entire hemisphere or more. In some embodiments of the invention, the optical components of the apparatus are used to gather light from the sun and the photodetector is a solar cell or solar cells, which may be selected to receive selected ranges of wavelengths of light.

BRIEF DESCRIPTION OF THE DRAWINGS

FIGS. 2B-2E show perspective views of selected exemplary embodiments of lens-mirror assemblies. As depicted in FIG. 2E, flat side 205 (the lower edge of which is represented by the horizontal dashed line) is present on the back side of the lens body 212.

DETAILED DESCRIPTION OF THE INVENTION

The term "radiation" refers herein to electromagnetic waves with wavelengths principally in the range from 100 nm to 15,000 nm, including but not limited to ultraviolet light, visible light, and infrared light.

The term "angle of arrival" is used herein to denote the direction from which detected radiation arrives or the direction from the detector to the source of the radiation. Angle of arrival (AoA) may be expressed using a coordinate system that is aligned with principal axes of the photodetector. The angle of arrival may be described by direction cosines with respect to principal axes of the device or with respect to the principal axes of any three-dimensional coordinate system.

Figure 1:
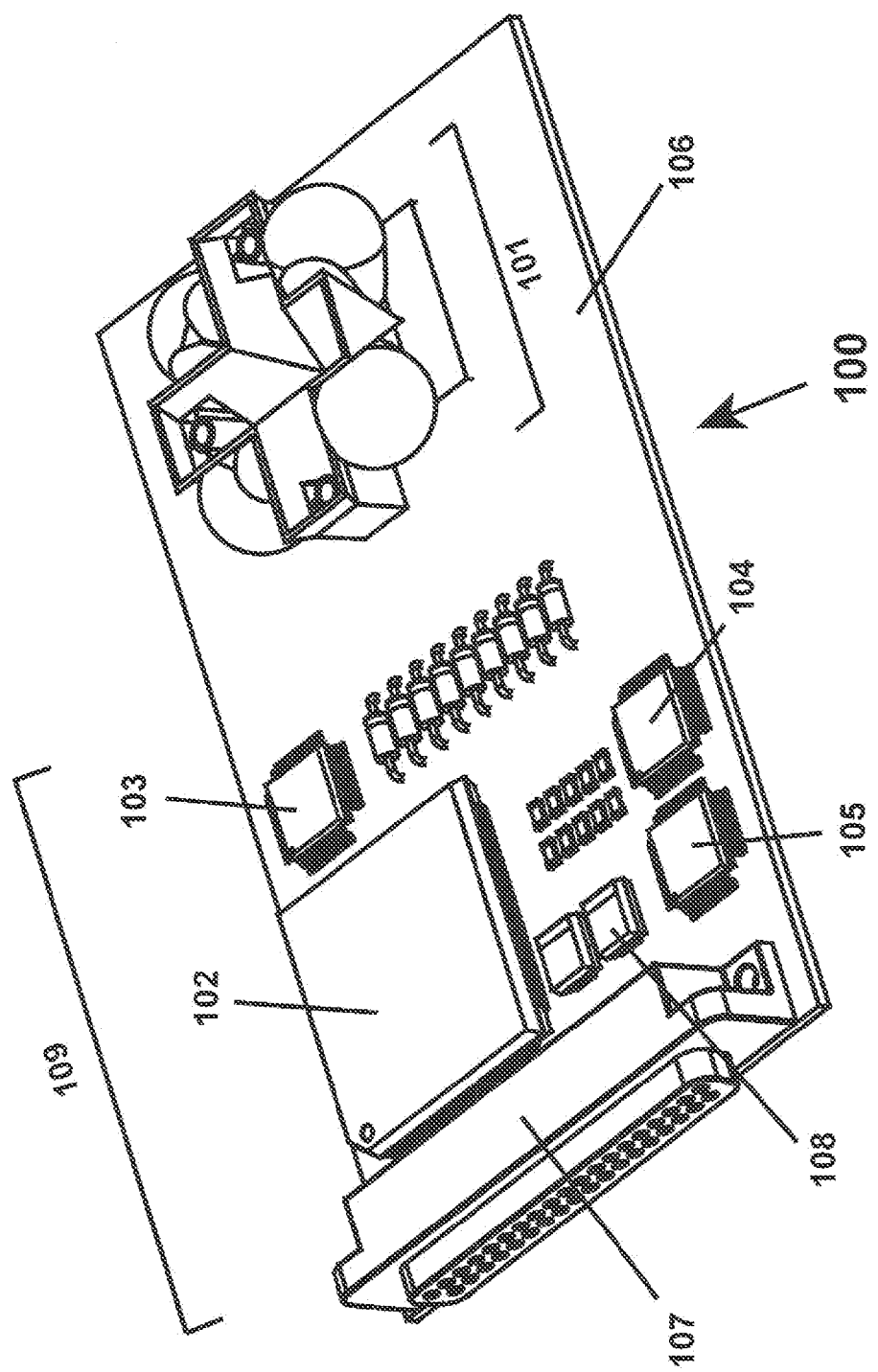
FIG. 1 is a perspective view of one embodiment of a radiation detector of the invention having a lens cluster and associated components.

FIG. 1 shows one embodiment of a radiation detector/analyzer assembly 100. This exemplary embodiment includes radiation detector 101 contained on a printed circuit board 106 having various data processing components 109. In various aspects of the invention the data processing components may comprise one or more of a CPU 102, memory 103, an analog-to-digital converter (ADC) 104, a logic array 105, power conditioning circuitry 108, and a connector 107. In one embodiment, data processing components 109 are included with the radiation detector 101, on the detector/analyzer assembly 100. In other embodiments, data are collected and transferred to a remote location for processing and analysis. For example, in one embodiment, the invention provides for separation of radiation detector 101 and data processing components 109 when the two are connected by a suitable cable (not shown). In this aspect of the invention, the data transfer connector cable enables transfer of information regarding operation of the detector and information regarding detected radiation. Optionally, the data transfer cable may also provide power to the data processing components. In embodiments having separated radiation detection 101 and data processing components 109, an optional housing unit (not shown) for the data processing components 109 may be provided.

Figure 2A:
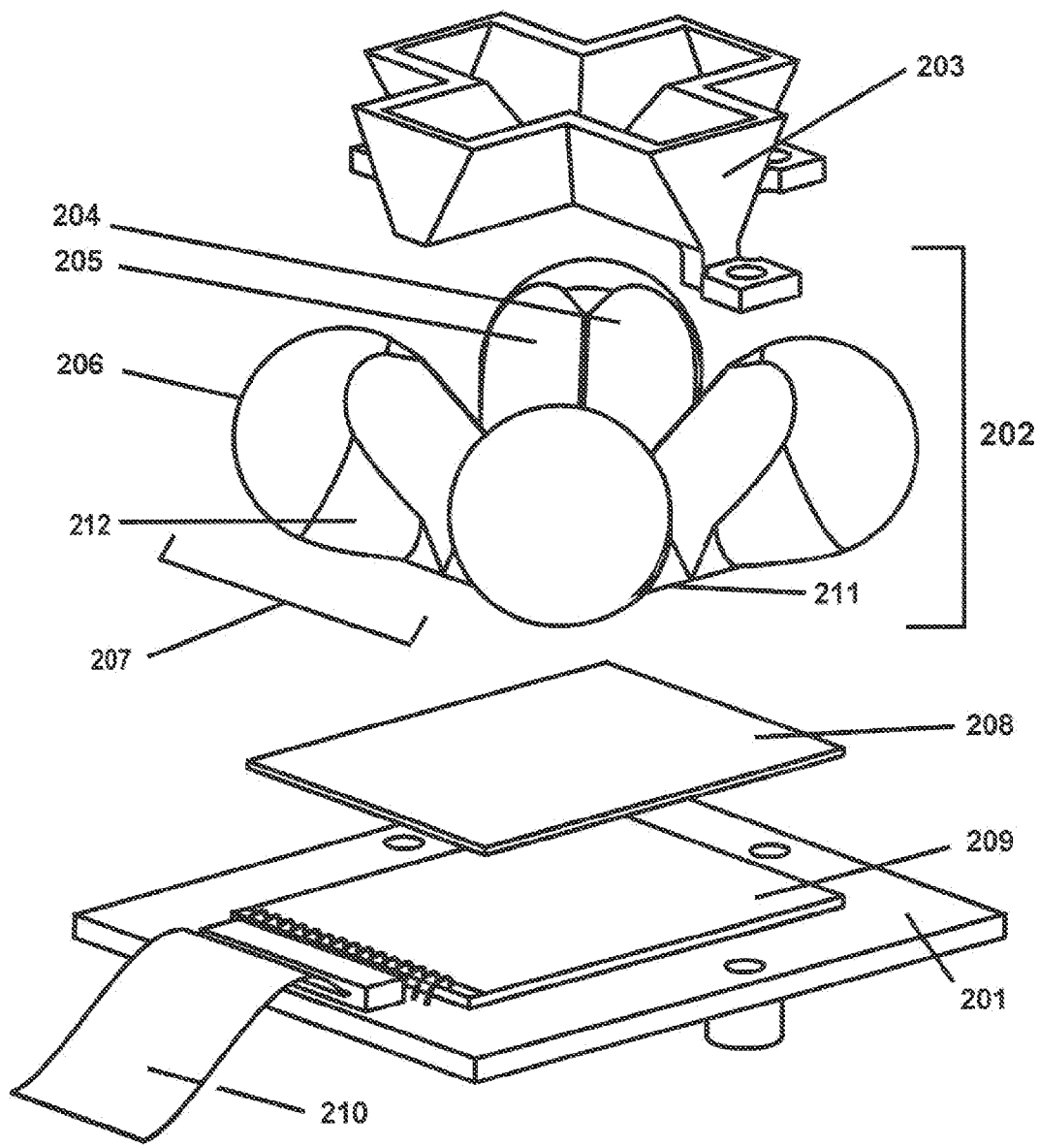
FIG. 2A is a perspective view of one embodiment of a radiation detector and associated components.

FIG. 2A shows an exploded view of one exemplary embodiment of radiation detector 101 and associated components. In this embodiment, a lens cluster 202 comprises four lens-mirror assemblies 207, each assembly being made from a monolithic piece of material having a positive lens 206 and a solid lens body 212, the lens being positioned at the distal end of the lens body. In this example, lens body 212 has adjacent flat surfaces comprising inwardly facing, adjacent mirrors 204 and 205 that direct radiation entering lens 206 onto photodetector 209.

In the exemplary embodiment of FIG. 2A, 207 represents one example of a "lens-mirror assembly" of the invention. As used herein, a "lens-mirror assembly" refers to a group of optical components comprising a positive lens, and first and second flat mirrors 204 and 205, the mirrors being adjacent. In the embodiment shown here, lens mirror assembly 207 also comprises lens body 212, but this is not a requirement. As used herein, "lens body" refers to a structure to which a lens is attached, typically at the distal end of the lens body. In embodiments of lens-mirror assembly 207 that also comprise lens body 212, lens body 212 has two adjacent flat sides or surfaces. In some embodiments lens body 212 is a prism. Prisms for use in a lens body may be solid or hollow and may be made from any material that allows for transmittance of radiation entering lens 206. Other examples of lens-mirror assemblies for use in embodiments of the invention are described below.

Lenses 206 for use in embodiments of the invention are positive lenses. As used herein, the terms "positive lens" and "converging lens" are used interchangeably and refer to a lens that is thicker in the middle than at the edges and that causes parallel rays of incident radiation to converge at a focal point on the opposite side of the lens. Examples of positive lenses are biconvex lenses (also referred to as double convex or convex lenses) and plano-convex lenses.

In some embodiments of the invention, one or more of lens 206, lens body 212, and lens cluster 202 may be constructed from a monolithic piece of material. In other embodiments, these may be made separately and subsequently assembled. In certain aspects, materials for making lenses, lens bodies, and lens clusters include injection-molded polymer or cut-and-polished glass. In another aspect, lens cluster 202 is molded from a single piece of acrylic polymer. In still other aspects, it is contemplated that lens 206 may be made using any process and/or material capable of producing an optical lens that will focus the light sufficiently to render the radiation detector 101 functional at any given operational parameters—e.g., within the range of wavelengths for which detection is required.

Lens body 212 or lens cluster 202 may also comprise a base 211 as shown in the embodiment depicted in FIG. 2A. In some embodiments, base 211 is part of a monolithic piece of material that comprises a lens body or lens cluster. In other embodiments, base 211 may be a separate piece of material and may be made from the same or different materials used for making lens 206, lens body 212, or lens cluster 202. In still other embodiments, color filter mosaic 208, photodetector 209, or matching assembly 303 may serve as a base. In these embodiments, a discrete base 211 is optional.

In some aspects of the invention lens cluster 202 may be mechanically constrained to a carrier 201 by an optional retaining piece 203 and be in alignment with color filter mosaic 208 and photodetector 209. Retaining piece 203 can be machined from a variety of materials, including for example metal or polymer, but in some aspects is constructed by injection-molding a polymer material.

"Lens cluster" refers to a group of lens-mirror assemblies. In various embodiments of the invention, lens cluster 202 may have two, three, four, or more lens-mirror assemblies 207. The lens cluster depicted in FIG. 2A comprises four lens-mirror assemblies, arranged with each lens directed to one of four different quadrants defined by x and y axes of photodetector 209. In some embodiments of the invention, a lens cluster may comprise two or more lens-mirror assemblies. Lenses 206 of a lens-mirror assembly 207 may be directed in opposite directions. For example a lens cluster comprising two lens-mirror assemblies, may have lenses 206 oriented in opposite directions relative to each other or even in other directions relative to each other. A lens cluster format is not a requirement for embodiments of the invention. In various embodiments, lens-mirror assemblies of radiation detector 101 are not present in a cluster, but rather may be arranged apart from one another, so as to enable or enhance gathering and detection of radiation arriving from a desired range of angles. Lens-mirror assemblies 207 may be arranged to gather radiation arriving over a hemisphere or more. Such arrangements may comprise lens-mirror assemblies in clusters or separated by some distance.

An optional carrier 201, for supporting lens-mirror assemblies 207 or lens clusters 202 may be located on a dedicated area of printed circuit board 106 or on a separate substrate designed to stand apart from the printed circuit board 106, in which case a cable 210 may be used to conduct electrical signals between the detector carrier 201 and the printed circuit board 106. In some embodiments of the invention, multiple lens clusters 202 may be present on a single carrier. Similarly, a radiation detector may comprise single or multiple lens clusters on multiple carriers. Radiation detectors comprising any combination of lens clusters and carriers are contemplated.

Multiple lens clusters present on a carrier 201 may have the same or different configuration or orientation of lens-mirror assemblies 207. For example, separate lens clusters on a single carrier may comprise two, three, four, or more lens-mirror assemblies 207, and lenses 206 may be oriented in any number of directions depending on the application of radiation detector 101. There are no restrictions on the number or arrangement of lens clusters that are part of a radiation detector.

In embodiments of the invention, a radiation detector comprises at least two lens-mirror assemblies and at least one photodetector 209 and is configured so that radiation entering lens 206 is directed to photodetector 209 or to one of two adjacent, flat mirrors 204 and 205 and thence onto photodetector 209.

In some embodiments of the invention, lens body 212 comprises flat, adjacent mirrors 204 and 205. In one exemplary embodiment, flat surfaces of lens body 212 are coated with inwardly facing reflective material thereby functioning as mirrors 204 and 205 so that radiation directed to them reflects from the sides and onto photodetector 209. One method of fabricating a lens body with mirrors 204 and 205 is by directly coating the adjacent flat surfaces using a solution that deposits a thin reflective coating; but, other methods and substances known in the art for fabricating reflective surfaces or mirrors may be used.

In other embodiments, adjacent flat surfaces of lens body 212 are not coated with reflective material. In some embodiments, mirrors 204 and 205 are operably positioned with respect to adjacent flat surfaces of a lens body 212. In some examples of these embodiments, a thin external reflective surface or mirror is positioned adjacent to and parallel with flat surfaces of each lens body. For example mirrors 204 and 205 may be attached to retaining piece 203 or may be a separate reflective piece placed between the adjacent flat surfaces of a lens body 212 and retaining piece 203. A non-limiting example of a reflective surface or mirror is a silicon wafer 500 µm thick, which is cut by laser to a shape that matches the adjacent flat surfaces of a lens body, and which is coated with reflective aluminum in an evaporation chamber, and then bonded with index-matching adhesive to the flat surfaces. In other embodiments, retaining piece 203 may be machined from metal and have polished adjacent flat sides that function as reflective surfaces or mirrors 204 and 205. In still other embodiments, mirrors 204 and 205 are not part of or associated with a lens body 212 or a retaining piece 203.

The number and configuration of lens-mirror assemblies 207 may vary in different embodiments of the invention. FIGS. 2B-2E show perspective views of selected exemplary embodiments of lens-mirror assembly 207, comprising lens 206 and flat, adjacent mirrors 204 and 205 that may be used in radiation detectors of the invention. FIG. 2B shows a different perspective of the lens-mirror assembly 207 in the embodiment of the radiation detector 101 depicted in FIG. 2A. In this perspective, lens 206 is facing rearward and is attached to a lens body 212 with flat, adjacent mirrors 204 and 205 attached thereto. FIG. 2C shows a side view of the lens-mirror assembly 207 depicted in FIGS. 2A and 2B. As described above, lens body 212 of this embodiment has lens 206 attached thereto and is positioned between lens 206 and mirrors 204 and 205 and is capable of transmitting radiation that has entered lens 206 and been reflected from mirrors 204 and 205. In some embodiments, lens body 212 is made from a monolithic piece of material and comprises solid material. Thus, in some aspects of the invention, radiation entering lens 206 and directed to photodetector 209 travels through a solid material. FIG. 2D shows a different embodiment of lens-mirror assembly 207, in which the assembly is not associated with a lens body 212. With this embodiment, radiation gathered by lens 206 is directed through air to photodetector 209 or to one or more of flat adjacent mirrors 204 or 205 and thence to photodetector 209. FIG. 2E shows an embodiment of the invention in which lens-mirror assembly 207 comprises lens 206 attached to a lens body 212 that is a prism.

In aspects of the invention, photodetector 209 is positioned such that radiation directed by lens-mirror assembly impinges on the photodetector. This position is typically beneath a lens-mirror assembly or a lens cluster as shown in FIG. 2A. Photodetector 209 may be any type of photodetector disposed to receive radiation passing through lens 206. In specific aspects of the invention, photodetector 209 comprises a single photodetector. In other aspects, a photodetector may comprise an array of photodetectors. In some embodiments of the invention, photodetectors for use with the radiation detector may be linear arrays or non-linear arrays. Photodetectors and photodetector arrays that may be useful in various embodiments of the invention are known in the art and are commercially available. Methods for making photodetectors are also known in the art.

In other aspects of the invention, a photodetector may be a solar cell. A solar cell is a device that converts the energy of light into electricity by the photovoltaic effect. Solar radiation collected by the lens mirror assemblies of one embodiment of the invention can be directed to one or more solar cells. Embodiments of the invention wherein a photodetector is a solar cell or comprises one or more solar cell are useful for converting solar radiation into electricity. Lens mirror assemblies of the invention increase the range of angles from which light can be gathered and converted to electricity. The effective aperture area of the lens mirror assemblies may be smaller than what would be achieved with a bare solar cell, making the peak efficiency of this embodiment less than that of a conventional solar energy collection system. However, because the lens mirror assemblies direct light from a large range of incident angles (at least one hemisphere), the solar cell is illuminated with solar radiation for an extended period of time during the day. It is a benefit to solar power users to have a relatively constant amount of power available for a longer duration of the day rather than to have a large peak power available for only a short duration. In addition, use of the invention for collecting solar radiation eliminates the need for a solar power collection system to track the sun as it moves across the sky during the course of a day. The wide range of angles from which light is gathered by the lens mirror assemblies can reduce the cost and complexity of a solar power collection system.

Solar radiation collected by the lens mirror assemblies can be directed to one or more solar cells, or can be split into selected spectral bands to increase the efficiency of solar power generation by employing a plurality of solar cells, each solar cell being selected to be most efficient in a selected band.

In other embodiments of the invention, a radiation detector further comprises a color filter mosaic 208. In certain aspects of the invention, a color filter mosaic 208 is positioned between lens-mirror assemblies 207, or lens cluster 202, and photodetector 209. Color filter mosaic 208 and photodetector 209 may be disposed and configured to enable detection of incoming radiation and determination of the wavelength or wavelengths of gathered radiation. In further aspects of the invention, radiation detector 101 is configured to allow for determination of the temporal duration or repetition rate of radiation directed by a lens to a photodetector. In other aspects of the invention, a radiation detector is configured to allow for determination of the angle of arrival of incoming radiation. Radiation detectors with single or multiple configurations as discussed above are contemplated.

In some embodiments, lens 206 has a focal length that focuses most radiation at about the plane of photodetector 209. A preferred focal length may be selected for different applications. The lens material's refractive index and the radius of its curvature determine this focal length. Radiation that enters lens 206 from an angle closer to the plane of photodetector 209 will be directed to first mirror 204 or second mirror 205, where it is then reflected by the mirror onto photodetector 209. By virtue of a longer path to the photodetector, such reflected radiation will have traveled a different distance after entering lens 206 than radiation that has entered at a higher angle, and will thus be somewhat defocused at the photodetector as compared to radiation that has not been reflected. The degree to which the radiation is defocused as it is detected by photodetector or photodetector array 209 contributes to determining the angle of arrival of the incoming radiation, as described more fully below.

Figure 3:
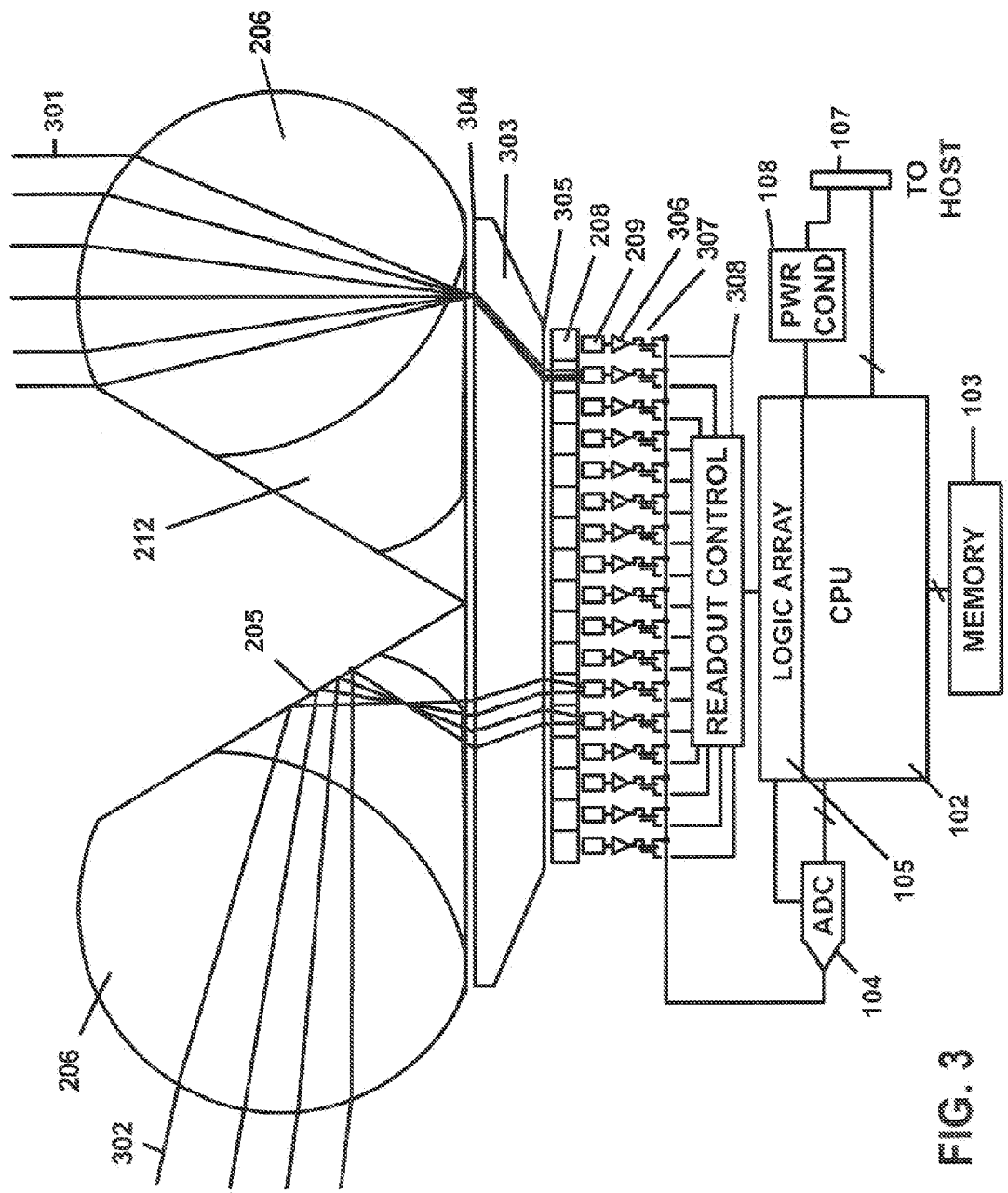
FIG. 3 is a schematic view of one embodiment of a radiation detector and associated data processing components. The parts of the detector are shown in an exploded view to enhance clarity of the detailed description.

Referring now to FIG. 3, a schematic illustration of one embodiment of radiation detector 101 and processing electronics 109 is disclosed, and their operation is more fully illustrated. Radiation 301 entering a lens 206 from higher angles of arrival relative to the plane of photodetector 209, (i.e., from nearer to the normal vector of the photodetector) is focused onto a small portion of an optional matching assembly 303 (not shown in FIG. 2) and thence onto photodetector 209. Radiation 302 entering a lens 206 from lower angles of arrival relative to the plane of photodetector 209 (i.e., from nearer to the plane of the photodetector 209), or even somewhat from below the plane of the photodetector, strikes one of mirrors 204 and 205 and reflects down onto matching assembly 303 and thence onto photodetector 209. This redirecting of the radiation arriving from low angles of incidence relative to the plane of the photodetector to higher angles of incidence relative to the plane of the photodetector enables detection of the radiation by photodetector 209. As a result of having traveled a distance in excess of the focal distance of lens 206, such reflected radiation 302 tends to be somewhat defocused onto matching assembly 303 than incoming radiation 301 that is not reflected by a mirror 205.

For purposes of description, the area surrounding the plane of the photodetector 209 may be represented by a sphere that is bisected by the plane of the photodetector, such that half of a sphere or a "hemisphere" is present on each side of the plane of the photodetector. The hemisphere on the side of the plane of photodetector 209 having lens-mirror assemblies 207 or lens cluster 202 is referred to herein as being "above" the plane of photodetector 209, and the hemisphere on the side of the plane of photodetector 209 opposite that of lens-mirror assemblies 207 or lens cluster 202 is referred to as being "below" or "beneath" the plane of the photodetector 209. In practice, a radiation detector 101 can be deployed in any physical orientation. For example, lens-mirror assemblies 207 may be directed toward the sky, or toward the ground, or in any direction. In some embodiments, two radiation detectors 101 may be assembled with their photodetectors positioned back to back such that the combination of lens-mirror assemblies 207 or lens clusters 202 are disposed and configured to gather and detect radiation arriving over a sphere surrounding the radiation detectors 101. That is, radiation arriving from any direction could be detected by the pair of radiation detectors 101.

In some embodiments of the invention, radiation detector 101 is configured to gather and detect radiation arriving from any angle or direction above the plane of the photodetector or from the "hemisphere" above the plane of the detector or from across an entire hemisphere. In other embodiments, radiation detector 101 is configured to gather and detect radiation arriving from the hemisphere above the plane of the photodetector 209 as well as radiation arriving from angles less than or equal to about 10 degrees below the plane of the photodetector. Radiation detectors configured in this way gather and detect radiation from across an area larger than a hemisphere. Using other terms, a radiation detector of the invention may be configured such that the range of angles of arrival of detectable radiation spans at least $2\pi$ steradians of solid angle.

In embodiments of the invention having lens cluster 202, one purpose of optional matching assembly 303 is to relay the spatial distribution of radiation falling on a first surface 304 of matching assembly 303 to a second surface 305 of the matching assembly, with some constant amount of magnification or demagnification, allowing the size of a lens cluster 202, to be substantially independent of the size of the color filter mosaic 208. In certain aspects of the invention, the matching assembly comprises a conventional imaging system comprising lenses or a fiber-optic taper either of which provide magnifications within at least the range between 0.25× and 4.0×.

Matching assembly 303 may also provide a redistribution of radiation other than by magnification or demagnification. For example, optical fibers can be used to map the two-dimensional first surface 304 of the matching assembly to a one dimensional second surface 305 that is compatible with a linear color filter mosaic 208 and underlying linear photodetector array 209. In alternative embodiments, optical fibers can affect particular coordinate transformations or can allow the continuous first surface 304 of the matching assembly 303 to be mapped to a second surface 305 that is a plurality of discrete regions, each mating to one of a plurality of discrete photodetectors, the plurality of photodetectors constituting a photodetector array 209.

In another embodiment of the invention, when the size of lens cluster 202 is well-matched to the size of photodetector 209, no matching assembly is required, and the radiation that is gathered and directed by lens-mirror assemblies 207 or a lens cluster 202 is coupled directly into photodetector 209 or is coupled directly into color filter mosaic 208 and thence into photodetector 209.

In some embodiment, color filter mosaic 208 comprises an array of radiation filters, whose function is to provide a wavelength-dependent transmittance through the mosaic. By virtue of a variety of radiation filters, color filter mosaic 208 defines the wavelengths or ranges of wavelengths of radiation, that are allowed to pass through the spectral mosaic and onto the underlying photodetector or photodetector array 209. In another embodiment of the invention, the color filter mosaic comprises an array of radiation up-converters, whose function is to absorb radiation of one wavelength and emit radiation of a different wavelength or wavelengths. In still other embodiments a color filter mosaic may comprise both radiation filters and radiation up-converters.

In embodiments of the invention, photodetector 209 may comprise any device that provides transduction of radiation to electrical signal, or also provide quantity, position, or timing information relating to the radiation striking it. As used herein, the terms "photodetector" and "photodetector array" are used interchangeably and refer to a single photodetector or a plurality of individual photodetectors. In one embodiment, photodetector array 209 may be formed from a single planar photodiode with a resistive contact that provides multiple electrical outputs that indicate position of light falling on the device. In another embodiment of the invention, photodetector 209 may comprise a single photosensitive element that detects all light entering lenses 206. In still another embodiment of the invention, photodetector 209 may comprise a regular arrangement or array of discrete photosensors, additional examples of which are thermal radiation detectors and bolometers. Photodetector 209 may also comprise a CMOS sensor, with or without an integrated color filter mosaic 208. Yet another embodiment of the invention includes a photodetector array 209 comprising four distinct radiation sensors, one to detect the light collected by each of four lens-mirror assemblies 207 (as depicted in FIG. 1 and FIG. 2A). In one aspect of this embodiment, individual lenses 206 or lens-mirror assemblies 207 need not be in proximity to one another.

In various embodiments of the invention, the photodetector array and associated components detect and measure the quantitative and spatial extent of radiation directed to the photodetector surface, with the centroid and extent of the spatial distribution of radiation indicating the angle of arrival of the radiation and the relative transmission through the color filter mosaic 208 indicating the wavelength or wavelengths of the radiation.

A photodetector 209 may comprise an image sensor or an array of photodetectors as may be found in a digital camera. In one embodiment of the invention, photodetector 209 is a commercially available monolithic semiconductor image sensor, such as are used in consumer digital cameras. In this type of image sensor, individual sensing elements, amplifiers 306, and readout electronics 308 are all defined and fabricated on the surface of a silicon chip during various processing steps familiar to those knowledgeable in the art of semiconductor manufacturing. To protect the finished photodetector array 209 from the environment, a passivation coating is usually applied to the surface. In this embodiment, additional semiconductor processing is performed to fabricate the color filter mosaic 208 on top of the photodetector array passivation coating. The result of the additional processing is a photodetector array comprising a monolithic image sensor with a color filter mosaic affixed directly to its surface in such a way that the precise alignment required between individual filter elements in the color filter mosaic 208 and individual sensor elements in the photodetector array 209 is accomplished and maintained permanently.

In the embodiment show in FIG. 3, radiation detector 101 also comprises an array of amplifiers 306 for use in converting radiation incident upon photodetector array 209 into a measurable electrical signal. The detector also comprises transistors 307 and readout control electronics 308, under control of electrical signals from logic array 105, to switch the analog signal from each photodetector to an analog-to-digital converter (ADC) 104 for digitization and subsequent processing of the digital value in central processing unit (CPU) 102. CPU 102 has associated digital storage memory 103, power conditioning circuitry 108, and a connector 107 that provides for input power and communications to an external host computer. It is contemplated that some or all of components ADC 104, logic array 105, amplifiers 306, transistors 307, and readout control electronics 308 may be integrated into a single semiconductor photosensor.

As described above, electromagnetic radiation arriving from different directions or angles will be directed by lens 206 to photodetector 209 by different paths. Radiation arriving from different angles and directions will be directed and/or focused by one or more positive lens 206 onto different areas of photodetector or photodetector array 209. Radiation that is directed to the photodetector by more than one lens may be directed to more than one location on the photodetector or photodetector array 209. The detection of the same wavelength or temporal characteristics of radiation at multiple locations on photodetector array 209 are factors used in determining angle of arrival, threat potential, and type of radiation impinging on the photodetector.

Figure 4A:
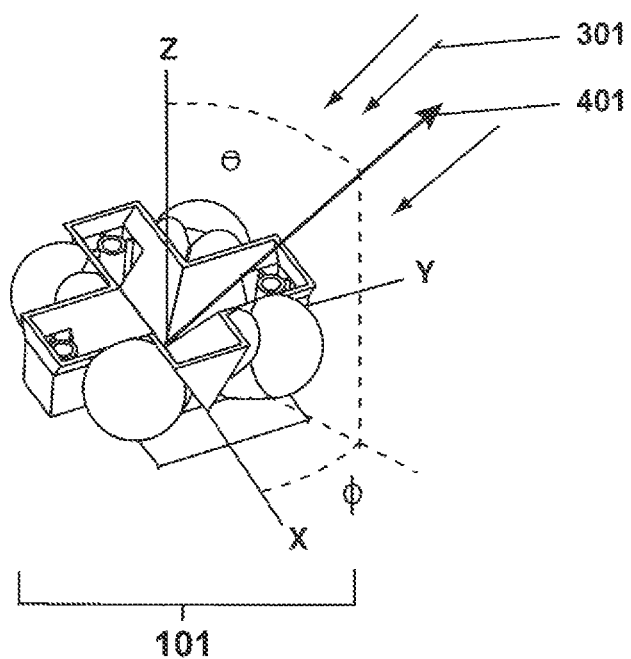
FIG. 4A shows the relationship between spherical coordinates θ and Φ, the x and y-axes of the photodetector and the normal vector to the photodetector.
Figure 4B:
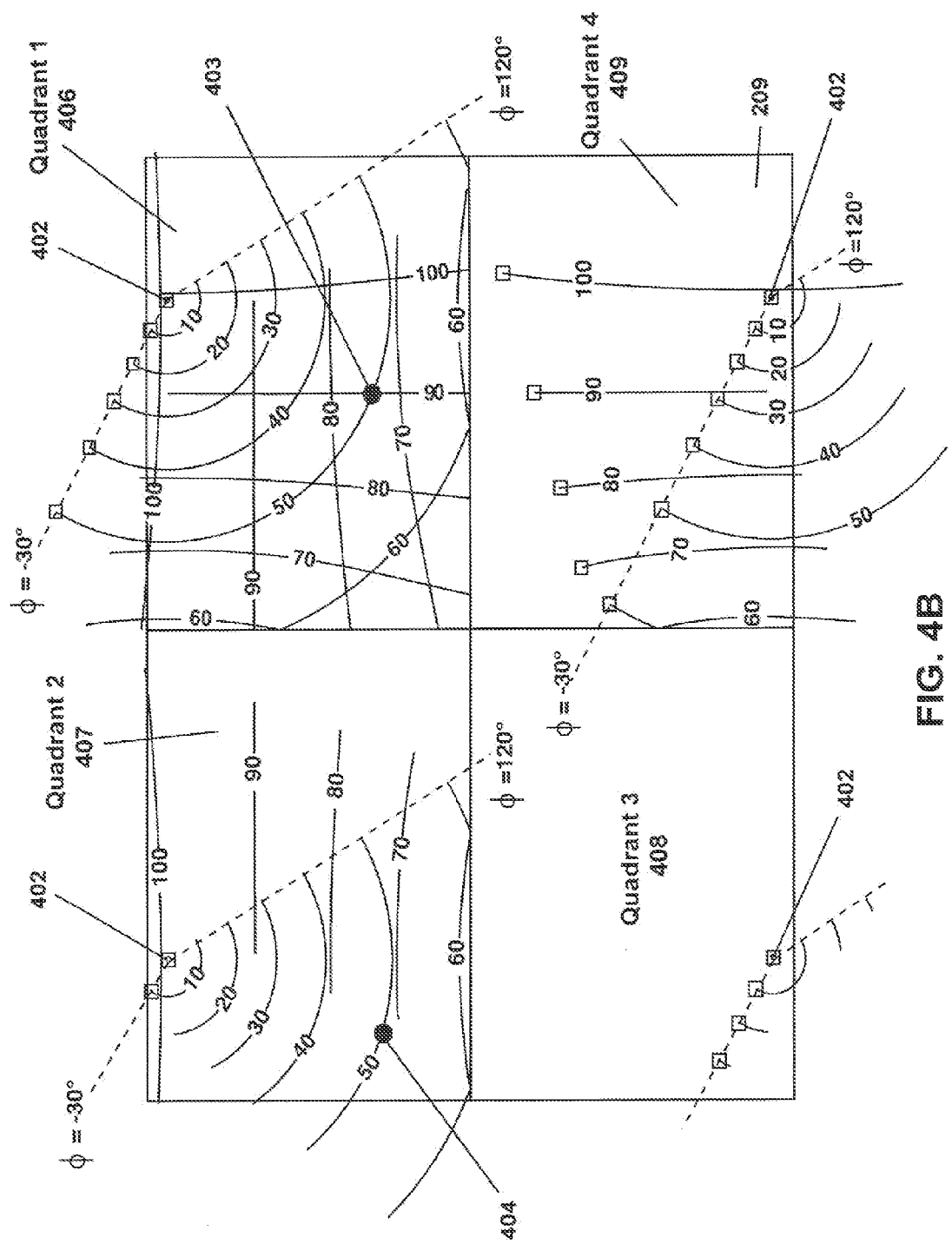
FIG. 4B demonstrates multiple distributions of radiation on a photodetector array from a single radiation source and a Cartesian coordinate system defined by x and y axes of and the normal vector to the photodetector.

FIGS. 4A and 4B describe the location of radiation striking photodetector array 209 as a function of its angle of arrival. A radiation detector of the invention may be configured such that the range of angles of arrival of detectable radiation spans at least $2\pi$ steradians.

In FIG. 4A one embodiment of radiation detector 101 is shown with incoming radiation 301 impinging upon it. In the most general case, radiation 301 can be said to be arriving from a direction uniquely determined by a vector 401 pointing from the center of lens cluster 202 to the source of radiation 301. For a local right handed Cartesian coordinate system defined in the frame of the radiation detector 101, with x, y, and z axes defined along the principal axes of the photodetector array 209 and the normal to the surface of the photodetector array, respectively, the two spherical coordinates, of the angle of arrival vector 401 can be formed by the angles that vector 401 makes with the z axis (in the case of and the angle that the projection of vector 401 into the x-y plane makes with the x-axis (in the case of. As an example, FIG. 4B shows the approximate positions at which radiation 301 may strike photodetector array 209 for angles of arrival with coordinates $0° \leq \leq 100°$ and $-30° \leq \leq 120°$. Each lens 206 directs radiation it receives to a distinct quadrant (406-409) of photodetector array 209. The origin of this Cartesian coordinate system is superimposed on the center of the photodetector array 209, and is depicted, with x and y axes, in FIG. 4B.

Radiation arriving from a source along the z-axis (=0°) of radiation detector 101 will enter all lenses 206 in the lens cluster 202, and in the embodiment shown in FIG. 4, will strike photodetector 209 at locations 402 in all four quadrants of photodetector array 209. Radiation arriving from other angles will strike photodetector array 209 at locations corresponding to the contours of (shown here as solid lines labeled 10, 20, 30, 40, 50, 60, 70, 80, 90, and 100), and along those contours by an amount depending upon the AoA coordinate. The small squares on the contours indicate the position where =−30°. Ambiguity regarding the measurement of the angle of arrival of incident radiation may exist. Such ambiguity may be the result of radiation entering more than one lens 206 or being reflected from one or mirror 204 or 205 from one or more lens-mirror assemblies, resulting in multiple signals on photodetector 209. Such ambiguity may be resolved by identifying and characterizing multiple signals from different areas or distributions of incident radiation on photodetector array 209. As one specific example of resolving such ambiguity, consider the location 403 in Quadrant 1 (406) of photodetector array 209. Location 403 represents the centroid of an "area", or "distribution", of a radiation signal on photodetector 209 caused by incident radiation having angles =50°, =60°, and also by incident radiation having angles =90°, =30° and also by radiation having angles =73°, =80°. The correct angle of arrival can be determined by noting the presence and/or absence of illumination in Quadrants 407, 408, and 409 of photodetector array 209. In this example, presence of an illumination signal at location 404, which could result from radiation having angles =50°, =60° or =72°, =85°, confirms that the signal detected at locations 403 and 404 is from radiation arriving with angles =50°, =60°, because this angle of arrival is common to both locations. When there is more than one possible angle of arrival corresponding to a particular signal distribution on the photodetector array, as determined from mapping to a Cartesian coordinate system, other measurements may also be used for resolving ambiguity. One such alternative means utilizes determination of the spatial extent in the x and y axes of a signal distribution on photodetector array 209. An exemplary measurement of the spatial extent of a photodetector signal is the mean radius of the signal distribution in the x and y axes on photodetector array 209. For example, the mean radius of an ellipsoid-shaped signal distribution may be represented by the geometric mean of the length of the major and minor axes of the ellipse. Another exemplary measurement of the spatial extent of a photodetector signal is the area of the signal distribution on photodetector array 209. A relatively larger mean radius or area of a photodetector signal striking the photodetector array 209 suggests that the radiation arrived from a larger angle (of incidence ≥60° and was reflected from mirror 204 or 205. If the mean radius or area of a signal distribution on photodetector 209 is small, this indicates that radiation is well-focused onto the photodetector array, indicating that it did not travel a distance consistent with reflection from a mirror 204 or 205 and further indicating a ≤60°. For example, a well-focused signal with a small spatial extent at location 403 would indicate radiation arriving from a direction with a smaller value of. Thus the radiation would be determined to be arriving from angles =50°, =60° rather than the other possible angles =90°, =80° and =73°, =80°

Experimental measurements or computations of centroids and spatial extents of distributions of radiation arriving from numerous known angles of arrival and impinging on a photodetector 209 of a given embodiment of radiation detector 101 allow for the development of a database or "lookup table" that may be used for subsequent determination of angles of arrival of radiation. "Centroid" as used herein refers to the x and y coordinates, with respect to the plane of the photodetector, of a distribution of radiation impinging on the detector. Experimental measurements of centroids and spatial extents are made by mounting a radiation detector in a goniometer and illuminating with collimated radiation from a laser or other source. Computations may be made with any one of several commercially available optics ray tracing software programs.

Figure 5:
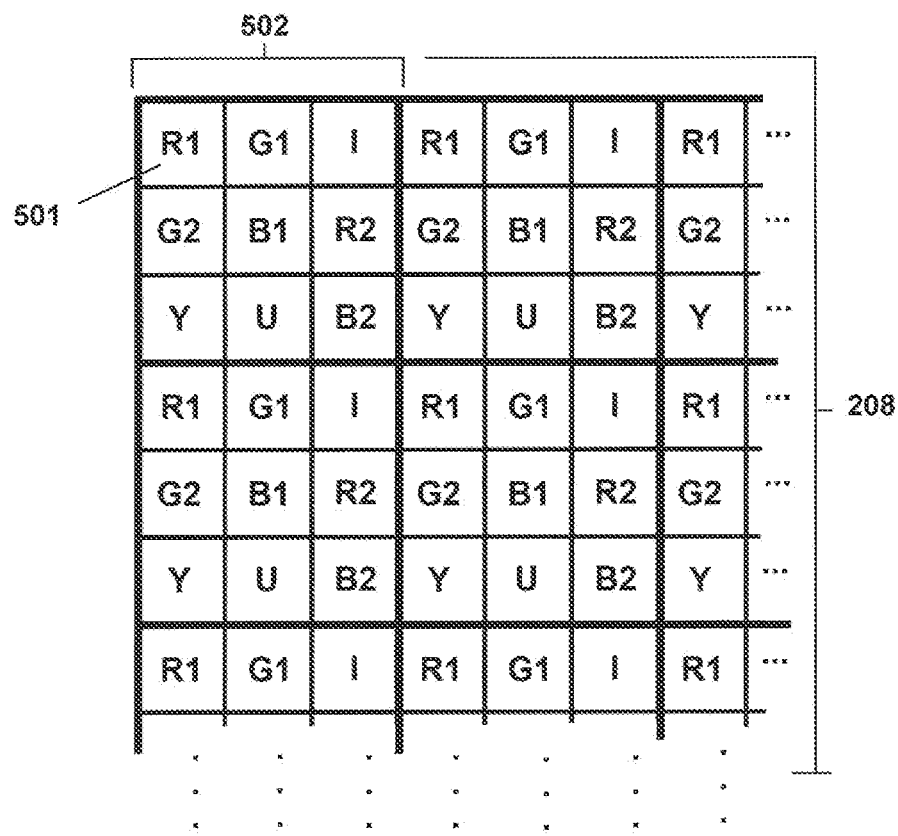
FIG. 5 illustrates one embodiment of the filter pattern of a color filter mosaic.

One embodiment of color filter mosaic 208 is shown in FIG. 5. Color filter mosaic 208 comprises multiple filter elements 501 on a substrate. Some filter elements 501 allow only certain wavelengths of electromagnetic radiation to pass through. One type of filter useful in some embodiments of the invention is made by a lithographic process common to the manufacture of semiconductor circuits. Filters made in this manner comprise photoresist impregnated with a dye, but any other form of color filter mosaic may be used in embodiments of the invention. Non-limiting examples of filters useful for some embodiments of color filter mosaic 208 include photographic transparencies, screen-printed arrays of colored dots, thin-film interference filters, quantum dots, nanoparticle materials, and colored glass fibers. The color filter mosaic 208 can be constructed directly on the surface of photodetector array 209, or can be made as a separate component to be integrated between photodetector array 209 and matching assembly 303 or between photodetector array 209 and lens-mirror assembly 207.

A repeating array of nine filter elements 501 is identified in FIG. 5 as a 3×3 superpixel 502. The array of nine filter elements is shown as an example of one embodiment of a superpixel, but any size array of different filter elements 501 may form a superpixel 502. The repeating filter elements 501 that form a superpixel 502 need not be arrayed in a square fashion. Indeed, any arrangement of filter elements 501 that accomplishes a repeating pattern will thereby define an array of superpixels 502 (e.g., a hexagonal arrangement). The color filter mosaic 208 may comprise an array of superpixels 502. In one embodiment, individual filter elements 501 are square-shaped and about 20 microns in length on each side and are sized so that an integer number of photodetector 209 elements are associated with the filter element 501. Filter elements 501 may be larger or smaller depending on the angular and wavelength resolution requirements of a particular realization of the invention.

In one embodiment of the invention, there is little or no space between color filter mosaic 208 and photodetector array 209, such that there is a known one-to-one correlation between a filter element 501 in color filter mosaic 208 and a given photodetector element in photodetector array 209. In other words, radiation from any direction that is filtered by a certain filter element 501 will be detected on or by a corresponding certain photodetector element in photodetector array 209, and that certain detector element in photodetector array 209 will not detect radiation that has been filtered by any other filter element 501. In some embodiments of the invention, it may be useful for the size of superpixel 502 to be designed such that it is the same size or smaller than the spatial extent of the distribution of radiation that may impinge on photodetector 209, thus facilitating the measurement of both centroid and wavelength of incident radiation.

As discussed in detail below, a particular filter element 501 may be a wavelength filter or a radiation up-converter. When radiation strikes a wavelength filter element 501, a fraction of the radiation passes through filter element 501, in accordance with its spectral transmittance at the wavelength of the incident radiation, and is detected by underlying portions of the photodetector array 209. Similarly, when radiation strikes an up-converter filter element 501, one of two things may happen: 1) the radiation causes the up-converter to fluoresce and the fluorescent radiation is detected by photodetector array 209; or 2) the radiation is blocked by filter element 501 and fails to cause it to fluoresce so that the radiation is not detected by photodetector array 209.

In certain aspects of the invention it is advantageous to have a diversity of color transmittances across the different filter elements 501. For example, the embodiment of FIG. 5 specifies filter elements 501 with distinct spectral characteristics (colors) and optical densities to increase the available detector dynamic range and to increase the accuracy of wavelength determination. Filter elements 501 denoted in FIG. 5 are R1, red-transmitting filter, regular optical density (OD); G1, green-transmitting filter, regular OD; I, infrared transmitting, visible-blocking filter; G2, green-transmitting, large OD filter; B1, blue transmitting filter, regular OD filter; R2, red-transmitting filter, large OD filter; Y, yellow-transmitting filter, regular OD; U, up-converter converting 1500 nm light to visible light; B2, blue-transmitting filter, large OD. This set of nine filter elements, which together make up superpixel 502 is illustrative of one embodiment of the invention and is not meant to be restrictive for other embodiments of the invention.

Figure 6:
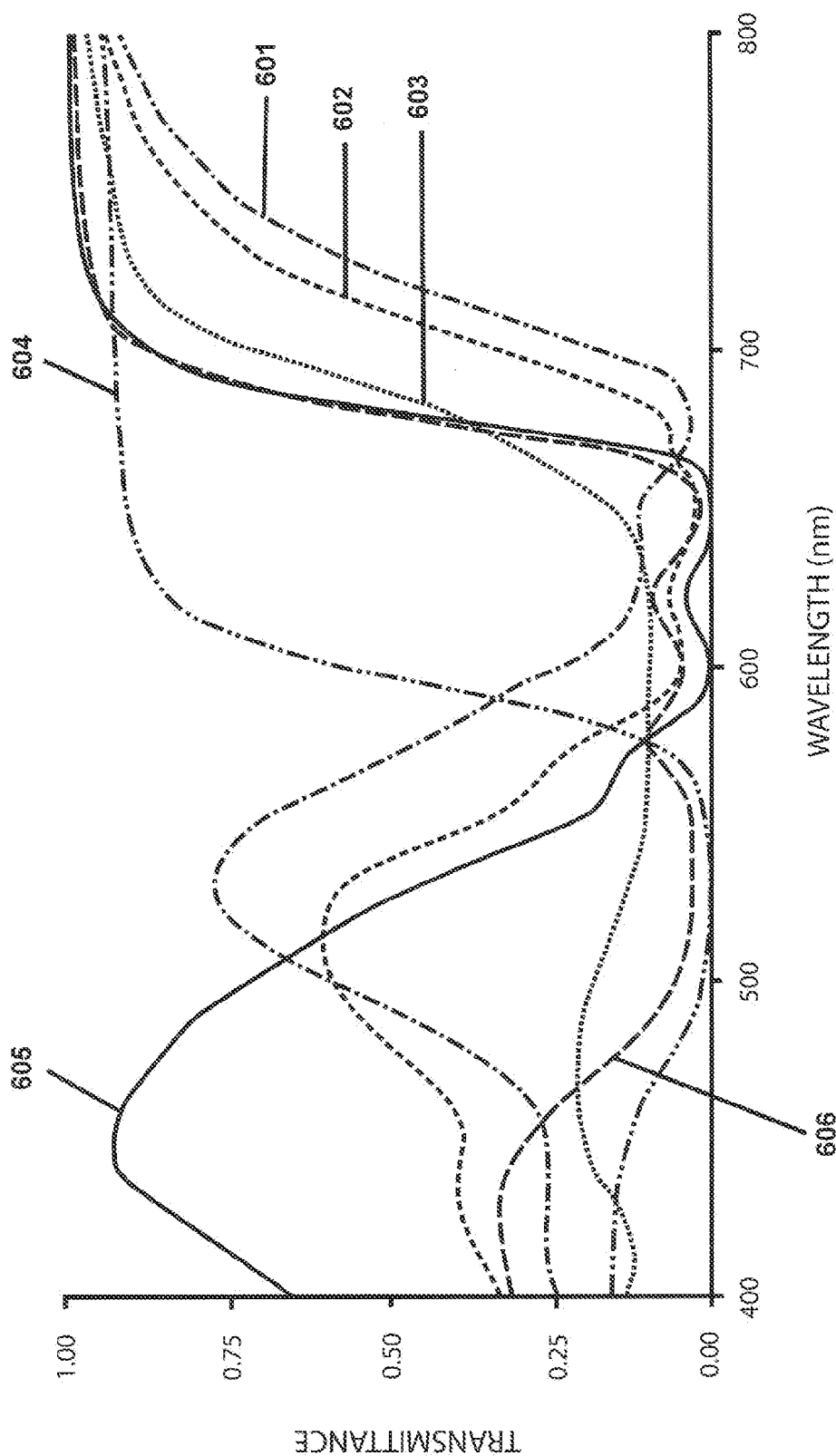
FIG. 6 is a diagram illustrating the spectral transmission of several dyes that are examples of those used in a color filter mosaic.

Some filter elements 501 may comprise dyes that have a specific spectral transmittance. By way of example, FIG. 6 illustrates the spectral transmittances (transmittance as a function of incident wavelength) for a set of six dyes. Spectral transmittance represented by line 601 is for the dye Permalex Green 975. Spectral transmittance represented by line 602 is for the dye Cyan. Spectral transmittance represented by line 603 is for the dye Permalex Black NB. Spectral transmittance represented by line 604 is for the dye Permalex Red 2B. Spectral transmittance represented by line 605 is for the dye Permalex Blue AP. Spectral transmittance represented by line 606 is for the dye Magenta. All of these dyes were obtained from Standard Dyes, Inc. of Winston-Salem, N.C. Other dyes useful for methods of the invention are readily available from commercial sources or may be custom manufactured. Additive mixtures of different dyes cause the resulting spectral transmittance of the mixture to be the product of the transmittances of the mixed dyes. This allows a desired spectral or color transmittance to be generated from combinations of one or more specific dyes, and this new dye mixture will have a transmittance that is thus linearly independent from the transmittances of its component dyes. This technique is useful for expansion of the number of independent filter elements 501 in a superpixel 502 from a smaller set of dyes.

Some filter elements 501 may comprise up-converting compounds (up-converters) rather than color filters. An up-converter is denoted here as any compound that fluoresces when exposed to a given range of electromagnetic radiation, and for which the fluorescent radiation is at a shorter wavelength than the exposure radiation. In one embodiment of the invention, the up-converters are various compounds that fluoresce in the visible spectrum under exposure to longer wavelengths of radiation, such as near-infrared light. Examples of up-converters useful in embodiments of the invention include oxides, fluorides, and sulfoxides of lanthanide metals such as Y and La, doped with one or more rare-earth elements, preferably Yb, Er, or Tm.

Figure 7:
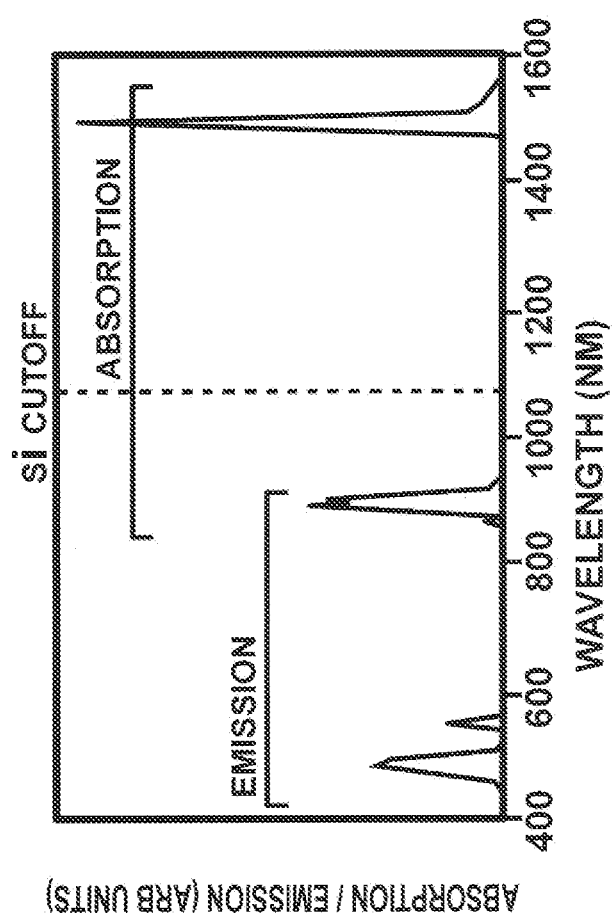
FIG. 7 is a diagram illustrating the absorption and emission characteristics of one example of a radiation up-converter, $La_2O_2S:Yb,Er$.

Silicon photosensors are not sensitive to radiation with wavelengths longer than 1100 nm, so the use of up-conversion compounds can allow detection of radiation comprising longer wavelengths by conversion to fluorescence from about 400 nm to about 1100 nm, which is visible to silicon photosensors. One example of an up-converter compound is $La_2O_2S$:Yb,Er, which can absorb radiation with wavelengths of approximately 900 nm, 980 nm, and 1500 nm, and thereupon emit fluorescence at wavelengths between approximately 500 nm and 550 nm. FIG. 7 illustrates the absorption and emission measured for $La_2O_2S$:Yb,Er. The up-converter absorbs radiation in two different portions of the spectrum, around 900 nm and 1500 nm (1.5 μm). The absorption of radiation causes the up-converter to fluoresce at about 500-550 nm and at about 900 nm, which may be detected by a silicon-based photodetector array 209. Up-converter compounds that fluoresce when exposed to radiation at multiple wavelengths may be made effective in detecting only one of those wavelengths by filtering out the other wavelengths before they reach the up-converter compound.

Up-converters useful in the invention are not limited to those that fluoresce only upon absorption of infrared radiation. Aspects of the invention may also utilize up-converting compounds that fluoresce upon exposure to radiation of other wavelengths. For example, a variety or mixture of up-converting compounds, each responding to a somewhat different range of electromagnetic radiation, may also be used in the invention. Preferably, an up-converting compound will absorb radiation at wavelengths not detectable by standard photodetectors and will fluoresce at wavelengths that are detectable.

Figure 8:
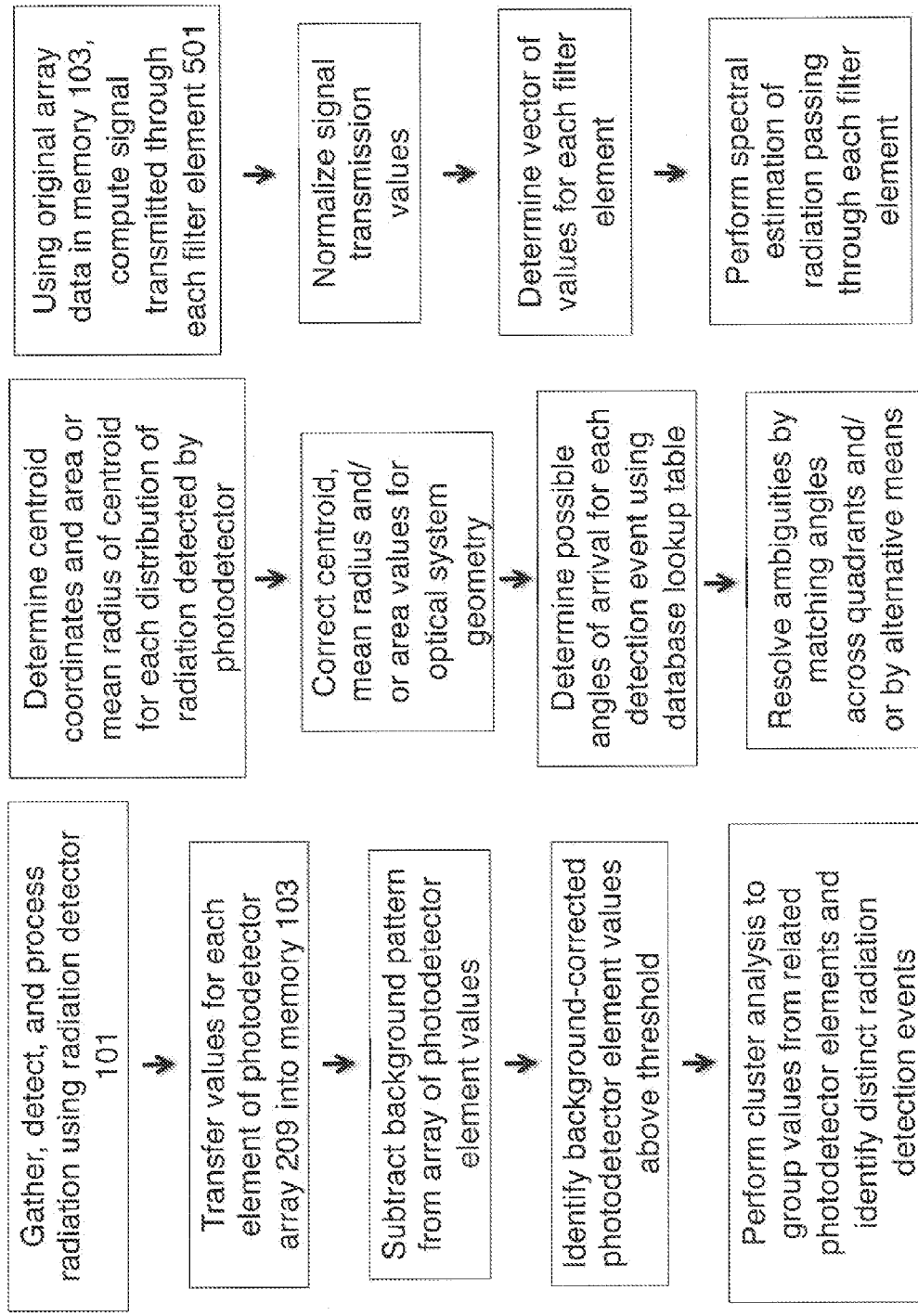
FIG. 8 illustrates exemplary methods for processing data associated with radiation directed to a photodetector.

FIG. 8A illustrates one embodiment of methods performed for analyzing radiation gathered and detected by detector 101. Data corresponding to the amount of radiation falling on each element of a photodetector array 209 are processed and transferred into a first data array in memory 103 by CPU 102. In certain optional aspects of the invention not shown in FIG. 8A, a reduced data array may be assembled and used for analyzing radiation. In these aspects, data from selected elements of photodetector array 209 may be summed and stored in a reduced data array in a separate location in memory 103. The reduced data array is smaller than the first data array by a factor of the number of the selected elements, and can thus be manipulated more rapidly by CPU 102. After assembly of a data array, a background pattern may be subtracted from the values in the array. The background data pattern may be a constant fixed-pattern background or a dynamically generated background determined from the measurement history of data arrays. After subtracting the background pattern, the data array is scanned for any elements that exceed a certain threshold value. In one embodiment the threshold is a constant fraction of the full-scale dynamic range of the photodetector array 209. In another embodiment the threshold value is a predetermined multiple of the mean of the data array values. In yet another embodiment, the threshold value is a dynamically determined value that takes into account the historical variance and mean of the measurements of the photodetector array 209 and the desired false alarm rate for detecting radiation.

Data from the array that are found to exceed the threshold are subjected to cluster analysis, in which data from groups of elements in close two-dimensional proximity to one another are assigned to a single so-called "event". The cluster analysis uses the known focusing characteristics of the optical system to reduce the possibly large number of data elements that exceed threshold into a smaller number of events that are statistically distinct. The cluster analysis also provides a measurement of the area of each distinct event that is found to exceed the threshold. These events represent distinct incidents of radiation detection by radiation detector 101.

FIG. 8B illustrates the analysis and interpretation of data for determining the angle of arrival. Each distinct radiation detection event that exceeds the threshold represents a distribution of radiation falling on the photodetector array 209 resulting in an area or distribution of signal on the photodetector. The CPU 102 analyzes the data stored in the array in memory 103 to determine the centroid of each distribution of radiation representing a distinct radiation detection event stored in the array. The centroid can be computed by any number of well-known techniques (e.g., determining the weighted mean in x- and y-), and is generally limited to the immediate area of the array that contains the data corresponding to the event. The result of the centroid determination is a pair of numbers or coordinates, for each distinct detection event, representing the positions of the centroids of the radiation distribution associated with each event. The area and/or the mean radius of each distribution of a photodetector signal, representing a radiation detection event, is also calculated by the CPU prior to AoA determination. Corrections can be made to the centroids, areas, and mean radii of photodetector signal distributions for offsets, rotations, or scale factors due to possible misalignment of the lens assembly 202 with the photodetector array 209. The centroid positions are used to determine possible angles of arrival for each radiation detection event. Possible ambiguities in the determination of the angle of arrival are resolved by matching angles and across different quadrants of photodetector array 209 as described above or by alternative methods such as by evaluating the spatial extent of a radiation distribution associated with a radiation detection event. Experimental measurements of centroids, mean radii, and areas of distributions of radiation arriving from numerous known angles of arrival and impinging on a photodetector 209 of a given embodiment of radiation detector 101 allow for the development of a database or "lookup table" that may be used for subsequent determination of angles of arrival of radiation.

FIG. 8C is a flowchart for calculating an estimate of the wavelength of radiation for each distribution of radiation detected by photodetector 209. In this exemplary embodiment, a color filter mosaic 208, present between lens-mirror assemblies 207 and photodetector array 209 and comprising filter elements 501, is used to filter radiation prior to detection by the photodetector array. An exemplary color filter mosaic may be one such as that shown in FIG. 5 comprising filter elements 501. For each radiation detection event, the data stored in the array in memory 103, corresponding to the original photodetector measurements in the region of the event, are examined to compute the mean signal transmitted through each filter element 501 in the illuminated superpixels 502. In this step, normalization of the signal transmission values within each superpixel 502 is performed to minimize the effect of non-uniform spatial illumination. In certain aspects of the invention not depicted in FIG. 8C, correction within the superpixel 502 can also be performed. After normalization, transmission values from the illuminated superpixels 502 are averaged to obtain a vector of values for each corresponding filter element 501 in the superpixel. These values are then multiplied by a matrix S to convert the vector of values into an estimate of the irradiance received at each wavelength, called the spectral irradiance. The matrix S is pre-computed from a series of measurements made from the product of the spectral transmittance of the individual filter elements 501 and the spectral responsivity of the photodetector array 209. These measurements are formatted as a bxm-sized matrix M, where b is the number of wavelength bins in the spectral transmittance measurements and m is the number of filter elements 501 in each superpixel 502. The matrix S is the inverse of matrix M. Since matrix M is generally not a square matrix, the pseudo-inverse, or Moore-Penrose inverse, is computed with the formula $S=(M^T M)^{-1} M^T$ where the superscript "T" is the transpose operator and the superscript "−1" denotes the inverse of a square matrix. Once matrix S is computed, it is stored in the memory 103 of CPU 102 until it is used for estimating the wavelength of radiation. Other methods for spectral estimation can be used in methods of the invention. For example, neural nets, Bayesian classifiers, and any method that uses the vector of signals transmitted through each filter element 501 to estimate the spectrum or primary spectral components of the incident irradiance may be used in the invention.

The disclosed radiation detection methods and apparatus are able to differentiate laser radiation sources of concern or interest from ambient light and from other light sources that are not of interest. For example, the spectral irradiance estimate can be used to discriminate amongst and between natural sources (e.g., sun, other stars and planets, sunlight reflections from lakes or other specular surfaces) and manmade sources (e.g., street lighting, searchlights, laser sources). Spectral irradiance from natural sources will generally have broad spectral features—while spectral irradiance from manmade sources such as lasers will be evidenced by a narrow spectral profile.

In aspects of the invention, following a radiation detection event, calculation of the AoA, and identification of the spectrum of the incident radiation, the event is time-stamped and merged into a list of potential threats. If the geometrical and/or spectral characteristics of the event duplicate those of an event already in the list, the entries are merged after calculation of the position and temporal intensity variance for the event. Changes in position of a radiation source may be further processed by a motion tracker to compute an angular trajectory for the event. Persistent events, that is, those that stay in the event list for more than a selected amount of time, or those that are deemed intermittent from the same angular location are examined for spectral irradiance profiles that are characteristic of threat radiation. Persistent events with threat-like spectra, such as for example a narrow wavelength band indicative of laser output, are labeled as threats and subsequently trigger a warning. Events that are not temporally recurring or persistent are dropped from the event list after a preselected period of time. Thus, the radiation detector system can quickly classify, track, and assess the degree of threat represented by an irradiation event, and can quickly provide notification of the presence of the threat as well as its characteristics.

Other embodiments of the invention enable discriminating among different types of radiation and analyzing threat potential. In one detector embodiment, for use in daylight, a discrete array of photodetectors 209 are AC coupled to amplifiers 210. In such a configuration, amplifiers 210 do not output a signal that is associated with the near-constant bright daylight background. Rather, rapid changes in signals transferred from the photodetector 209 will indicate a pulsed radiation source, even if much less bright than background light.

In another embodiment of the invention, non-pulsed laser radiation incident on an AC-coupled photodetector 209 would not be detected if not for the fact that the beam propagates through the atmosphere, which causes it to scintillate. The scintillation will cause it to be detected as a coherent source separate from ambient light and thus identified as a potential threat.

Still other embodiments of the invention may comprise detectors with amplifiers that are DC coupled to the CPU 102. Some embodiments of such detectors are useful during nighttime and are particularly well suited for use on civilian aircraft. Certain embodiments of DC coupled detectors are also useful in daylight and will detect any lasers that are visible to a flight crew or that are powerful enough to damage a flight crew's vision or cause distraction.

In various aspects of the invention, depending upon the particular application and method of use of the detector, data processing parameters and limits associated with any or all steps can be adjusted to increase and/or decrease either or both of detection probability and false-alarm rate.

Example 1

Exemplary Radiation Detector, Data Processing Components, and Radiation Detection and Measurements The inventors constructed an embodiment of radiation detector 101 and associated data processing components. The detector has a field of view far greater than one hemisphere (>2 sr). That is, it is able to detect radiation arriving from across a field of view comprising over an entire hemisphere, with an almost-constant collection aperture over the entire solid angle. The detector gathers radiation and computes angle-of arrival and wavelength with an accuracy of ±1° and ±20 nm, respectively, over the near-ultraviolet, visible, and near-infrared spectrum. The data processing components include a real-time signal processor that provides computational full-frame-rate threat detection and source geolocation processing. This technology was developed for use on low-earth-orbit satellites, to provide information on source location in the event of ground-based laser illumination of a space object.

The radiation detector was developed to be a space-worthy sensor system in a 1U cubesat format to emphasize the ruggedness, compact footprint, low weight, and low power aspects of the technology. The cubesat-based radiation detector comprises an optical detector circuit board and signal processor circuit board in cubesat 1 U form factor. The novel hemispherical FOV quad optical system is mechanically mounted directly to the package of the image sensor. The entire system, detector and data processing components were contained within a volume of 3.5"×3.8"×1.8" (roughly 30% of the available 1 U volume), had a mass of 160 grams, and consumed 3.5 Watts peak (0.35 W standby) from a 7-12 VDC power bus.

Figure 9:
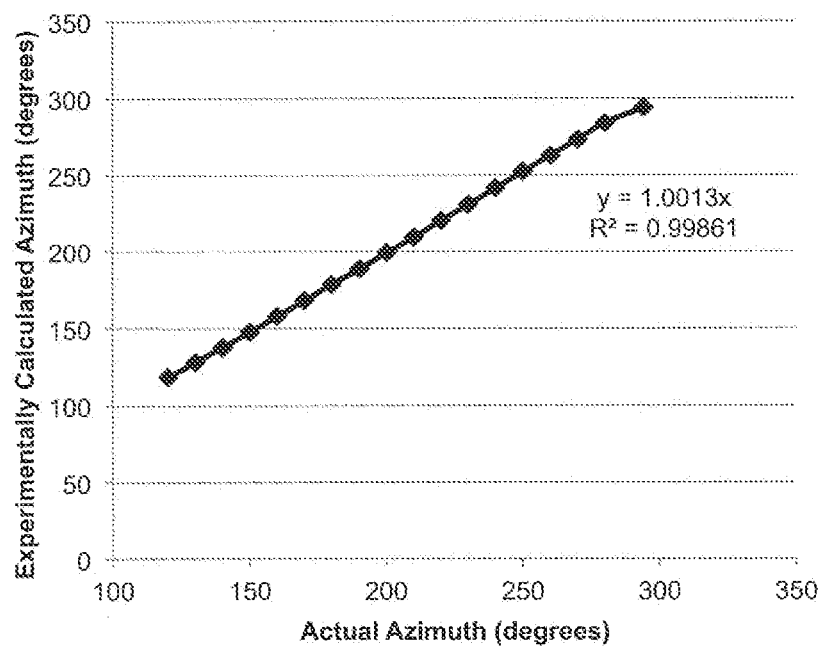
FIG. 9 is a graph showing calculated versus measured azimuth angles (, by a radiation detector, compared to known values.
Figure 10:
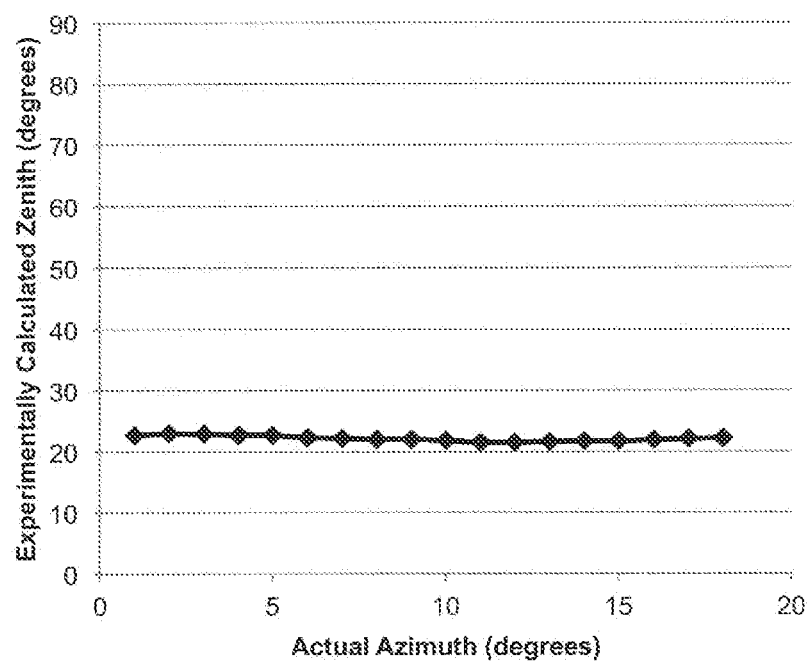
FIG. 10 is a graph showing calculated versus measured zenith angles ( by a radiation detector, compared to known values.

The detector and data processing components were evaluated in the laboratory using a rotational stepper motor and a 532 nm laser light source. The stepper motor was mounted to an optical breadboard with the radiation detector mounted orthogonally to the motors rotation, with the lens-mirror assemblies of the detector centered along the stepper motor axis of rotation. The 532 nm laser source (green) was collimated and expanded to overfill the sensor system such that the incident beam was input to the detector plane orthogonally. The stepper motor was then set to 20 degrees zenith (=20°, and the detector was rotated along the detector's normal axis to simulate azimuth angles from 120 degrees to 290 degrees. Images of radiation impinging on the photodetector were captured at 10-degree intervals, and embedded angle of arrival calculations were logged within the captured file names. Azimuth ( (FIG. 9) and zenith ( (FIG. 10) angles were determined using the methods described in FIG. 8A and FIG. 8B and both compared well to actual values. The correlation factor of calculated and actual azimuth angle was 0.99861, as shown in FIG. 9.

It should be understood that the detailed description and the specific examples, while indicating specific embodiments of the invention, are given by way of illustration only. Although the present invention has been described with respect to specific details, it is not intended that such details should be regarded as limitations on the scope of the invention, except to the extent they are included in the accompanying claims. While the compositions and methods of the invention have been described in terms of embodiments, it will be apparent to those of skill in the art that variations may be applied to the compositions and methods, and in the steps or sequences of the methods, described herein, without departing from the concept, spirit, and scope of the invention.

We claim:

1. A radiation detector comprising:
   (a) a photodetector, and
   (b) a plurality of lens-mirror assemblies, each lens-mirror assembly comprising a positive lens, a first mirror and a second mirror, the first and second mirrors being adjacent, wherein the lens is disposed to direct radiation from a first range of angles of arrival to the first mirror, radiation from a second range of angles of arrival to the second mirror and radiation from a third range of angles of arrival to the photodetector, the mirrors being disposed to reflect radiation to the photodetector.

2. The radiation detector of claim 1 wherein the lens-mirror assemblies are disposed and configured to direct radiation arriving from across a hemisphere or more to the photodetector.

3. The radiation detector of claim 1 comprising a plurality of photodetectors.

4. The radiation detector of claim 3 wherein the photodetectors form an array of photodetectors.

5. The radiation detector of claim 4 wherein the array of photodetectors is an image sensor.

6. A method for analyzing electromagnetic radiation, comprising:
   providing the apparatus of claim 4;
   placing the apparatus in a selected orientation to collect the electromagnetic radiation;
   measuring the output of the array of photodetectors; and
   comparing the measured output of the array to a known output of the array previously determined as a function of azimuth and zenith angles of incident radiation to determine the azimuth and zenith angles of incident radiation with respect to the selected orientation of the apparatus.

7. The method of claim 6 wherein the measured output of the array and the known output of the array previously determined include cluster analyses of selected photodetectors.

8. The method of claim 6 further providing a color filter mosaic operably positioned between the plurality of lens-mirror assemblies and the array of photodetectors and computing signal transmitted through the filter mosaic to determine the wavelength of the electromagnetic radiation.

9. The radiation detector of claim 1 wherein the photodetector is a solar cell.

10. The radiation detector of claim 4 further comprising a color filter mosaic operably positioned between the plurality of lens-mirror assemblies and the array of photodetectors.

11. The radiation detector of claim 10, wherein the color filter mosaic comprises a radiation filter or a radiation up-converter.

12. A method for analyzing radiation detected by the radiation detector of claim 10, comprising:
   determining a centroid position and a mean radius of at least one distribution of radiation detected by the photodetector, identifying a wavelength of the detected radiation at a distance from the centroid position that is less than or equal to the mean radius.

13. The method of claim 12 further comprising evaluating a photodetector signal for information about one or more of temporal characteristics, angle of arrival, or irradiance of directed radiation.

14. The radiation detector of claim 1 wherein the first range of angles of arrival, the second range of angles of arrival, and the third range of angles of arrival together continuously span a range of at least $2\pi$ steradians.

15. The radiation detector of claim 1 wherein each lens mirror assembly of the plurality of lens-mirror assemblies further comprises a lens body.

16. The radiation detector of claim 15 wherein one or more lens bodies is a prism.

17. The radiation detector of claim 15 wherein each the lens-mirror assembly comprises plano-convex lenses.

18. The radiation detector of claim 15 wherein the lens body is a molded polymer.

19. The radiation detector of claim 1 wherein the plurality of lens-mirror assemblies is equal to four.

20. The radiation detector of claim 1 further comprising a matching assembly disposed between the plurality of lens-mirror assemblies and the photodetector.

21. A method for analyzing radiation detected by a radiation detector of claim 1, comprising:

determining a centroid position and a spatial extent of at least one distribution of radiation detected by the photodetector.

22. The method of claim 21 further comprising:
comparing the coordinates of the centroid position and the value of the spatial extent with coordinates of a centroid position and value of a spatial extent from a radiation distribution having a known angle of arrival; and
identifying the angle of arrival of the directed radiation.

23. The method of claim 22 wherein the centroid position and spatial extent of at least two distributions of radiation detected by the photodetector are determined.

24. A method of converting solar radiation to electricity, comprising:
providing a plurality of lens-mirror assemblies, each lens-mirror assembly comprising a positive lens, a first mirror and a second mirror, the first and second mirrors being adjacent, wherein the lens is disposed to direct radiation from a first range of angles of arrival to the first mirror, radiation from a second range of angles of arrival to the second mirror and radiation from a third range of angles of arrival to a solar cell, the mirrors being disposed to reflect radiation to the solar cell; and
placing the plurality of lens-mirror assemblies between the solar cell and the sun whereby electricity is generated.

* * * * *

UNITED STATES PATENT AND TRADEMARK OFFICE
CERTIFICATE OF CORRECTION

Page 1 of 2

PATENT NO. : 8,878,114 B2
APPLICATION NO. : 13/587017
DATED : November 4, 2014
INVENTOR(S) : Bryon G. Zollars et al.

It is certified that error appears in the above-identified patent and that said Letters Patent is hereby corrected as shown below:

In the Specification

Column 3, Line 29, "azimuth angles ( , by a radiation detector" should read --azimuth angles (θ), by a radiation detector--; Line 32, "zenith angles ( by a radiation detector" should read --zenith angles (ϕ), by a radiation detector--.

Column 10, Line 56, "the two spherical coordinates, of" should read --the two spherical coordinates θ, ϕ of--; Line 58, "z-axis (in the case of and the" should read --z-axis (in the case of θ) and the--; Line 60, "x-axis (in the case of." should read --x-axis (in the case of ϕ).--; Lines 62-63, "for angles of arrival with coordinates 0° ≪100° and -30°≪120°." should read --for angles of arrival with coordinates 0°≤θ≤100° and -30°≤ϕ≤120°.--.

Column 11, Line 1, "the z-axis (=0°) of" should read --the z-axis (θ=0°) of--; Line 7, "to the contours of (shown here as solid" should read --to the contours of θ (shown here as solid--; Line 9, "upon the AoA coordinate." should read --upon the AoA coordinate ϕ.--; Lines 10-11, "The small squares on the contours indicate the position where =-30°." should read --The small squares on the θ contours indicate the position where ϕ=-30°.--; Lines 23-25, "having angles =50°, =60°, and also by incident radiation having angles =90°, =30° and also by radiation having angles =73°, =80°." should read --having angles θ=50°, ϕ=60°, and also by incident radiation having angles θ=90°, ϕ=30° and also by radiation having angles θ=73°, ϕ=80°.--; Line 30, "having angles =50°, =60° or =72°, =85°," should read --having angles θ=50°, ϕ=60° or θ=72°, ϕ=85°,--; Line 32, "with angles =50°, =60°, because" should read --with angles θ=50°, ϕ=60°, because--; Lines 50-51, "larger angle (of incidence ≥ 60° and was" should read --larger angle (θ) of incidence θ ≥ 60° and was--; Line 56, "further indicating a ≤ 60°." should read --further indicating a θ ≤ 60°.--; Lines 60-61, "from angles =50°, =60° rather than the other possible angles =90°, =80° and =73°, =80°" should read --from angles θ=50°, ϕ=60° rather than the other possible angles θ=90°, ϕ=80° and θ=73°, ϕ=80°.--.

Signed and Sealed this
Tenth Day of January, 2017

Michelle K. Lee
*Director of the United States Patent and Trademark Office*

Column 17, Lines 18-19, "one hemisphere (>2 sr)." should read --one hemisphere (>2π sr).--; Lines 54-55, "20 degrees zenith (=20°, and the" should read --20 degrees zenith (θ=20°), and the--; Line 56, "azimuth angles from 120 degrees" should read --azimuth angles (φ) from 120 degrees--; Line 60, "Azimuth ((FIG. 9) and zenith ((FIG. 10) angles" should read --Azimuth (φ) (FIG. 9) and zenith (θ) (FIG. 10) angles--.

In the Claims

Column 19, Lines 17-18, Claim 17, "The radiation detector of Claim 15 wherein each the lens-mirror assembly comprises plano-convex lenses." should read --The radiation detector of Claim 15 wherein each lens-mirror assembly comprises a plano-convex lens.--.